US006841775B2

(12) United States Patent
Kondo et al.

(10) Patent No.: US 6,841,775 B2
(45) Date of Patent: Jan. 11, 2005

(54) ELECTRON MICROSCOPE

(75) Inventors: Yukihito Kondo, Tokyo (JP);
Mitsuhide Matsushita, Tokyo (JP);
Mitsuaki Ohsaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/437,265

(22) Filed: May 13, 2003

(65) Prior Publication Data

US 2004/0031921 A1 Feb. 19, 2004

(30) Foreign Application Priority Data

May 13, 2002 (JP) ....................................... 2002-137720

(51) Int. Cl.⁷ .............................................. H01J 37/26
(52) U.S. Cl. ...................... 250/306; 250/311; 250/310; 250/396 R; 250/491.1
(58) Field of Search ................................ 250/311, 306, 250/310, 396 R, 491.1

(56) References Cited

U.S. PATENT DOCUMENTS

| 4,866,273 | A | * | 9/1989 | Kobayashi et al. | ......... 250/311 |
| 5,300,776 | A | * | 4/1994 | Krivanek | .................... 250/307 |
| 6,677,585 | B2 | * | 1/2004 | Nomura | ...................... 250/310 |

OTHER PUBLICATIONS

F. Hosokawa et al. entitled "On–line alignment system for TEM using a TV and personal computer", *Inst. Phys. Conf. Ser. No. 138: Section 11, Paper presented at the Electron Microscopy and Analysis Group Conf. EMAG93, Liverpool*, 1993, pp. 531–534.

F. Hosokawa et al. entitled "On–line alignment and astigmatism correction using a TV and personal computer", *Proceedings Fifty–First Annual Meeting Microscopy Society of America*, Cincinnati, Ohio, Aug. 1–6, 1993, pp. 202–203.

* cited by examiner

*Primary Examiner*—John R. Lee
*Assistant Examiner*—Zia R. Hashmi
(74) *Attorney, Agent, or Firm*—Webb Ziesenheim Logsdon Orkin & Hanson, P.C.

(57) ABSTRACT

An electron microscope which permits an operator to perform astigmatic correction and beam alignment. A field of view capable of clearly displaying astigmatism or beam misalignment in terms of a Ronchigram is placed on the optical axis. Then, the operator selects a Ronchigram display mode. A first or second TV camera such as a CCD camera is selected and placed on the optical axis while maintaining the electron optics in the STEM imaging mode. Under this condition, a Ronchigram signal is obtained from the TV camera and supplied to a computer via a TV power supply and an interface. As a result, a Ronchigram of appropriate size and brightness is displayed in an image display region on a display device. The operator corrects astigmatism or adjusts the alignment while observing the Ronchigram.

6 Claims, 4 Drawing Sheets

ELECTRON MICROSCOPE

BACKGROUND OF THE INVENTION

1. Field of the Invention

The present invention relates to an electron microscope designed to focus an electron beam onto a specimen by condenser lenses and an objective lens, to scan the beam across the specimen, to detect electrons transmitted through the specimen, and to image the resulting signal in synchronism with the scanning of the beam.

2. Description of Related Art

Where an electron microscope is operated in the STEM imaging mode, an electron beam produced from an electron gun and accelerated is sharply focused onto a specimen by an illumination lens system consisting of condenser lenses and an objective lens. A desired area on the specimen is scanned by the beam. Since the electron beam is directed at the specimen, some of the electrons are transmitted through the specimen. These electrons are detected. The resulting signal is supplied to a display device according to the scanning of the primary electron beam. Thus, a STEM image of the specimen is displayed.

In this electron microscope, the resolution of the final image depends on the degree of astigmatism in the electron beam hitting the specimen and on the degree of misalignment of the beam with respect to the optical axis. Therefore, a stigmator and an alignment device are attached to each lens. A STEM image is displayed in practice. The operator adjusts the stigmator and alignment device to optimize the state of the image while observing it.

However, it is quite difficult even for the skilled operator to correct astigmatism sufficiently or align the beam by adjusting the stigmator or alignment device while watching the STEM image. This astigmatic correction must be done during normal SEM imaging mode, as well as during STEM imaging mode.

SUMMARY OF THE INVENTION

In view of the foregoing, the present invention has been made. It is an object of the present invention to provide an electron microscope permitting even an unskilled operator to perform astigmatic correction and beam alignment easily.

This object is achieved by an electron microscope having an electron gun for producing an electron beam, the microscope being capable of being switched between (a) a TEM imaging mode in which the electron beam is directed at a specimen by an illumination lens system, a TEM image of the specimen is formed out of electrons transmitted through the specimen by an imaging lens system, and the TEM image is made visible by observational means, and (b) SEM imaging mode in which the electron beam is focused onto the specimen by the illumination lens system, the beam is scanned across the specimen in two dimensions by deflection means mounted on a side of the specimen that faces the electron gun, resulting electrons from the specimen are detected by an electron detector, and a scanned image of the specimen is displayed on display means according to an output signal from the electron detector. This electron microscope further includes astigmatic correction means for correcting astigmatism in the electron beam directed at the specimen and beam alignment means for aligning the electron beam directed at the specimen with respect to the optical axis. The electron microscope is characterized in that it further includes instruction means for commanding a Ronchigram display mode and a control system. When the Ronchigram display mode is commanded through the instruction means, the control system controls the illumination lens system in such a way that the electron beam from the electron gun is focused onto the specimen, controls the deflection means such that the electron beam is stationarily directed at the specimen, and controls the imaging lens system such that a diffraction image on the optical axis which is created by electrons transmitted through the specimen is made visible by the observational means.

Other objects and features of the invention will appear in the course of the description thereof, which follows.

DESCRIPTION OF THE PREFERRED EMBODIMENTS

Figure 1:
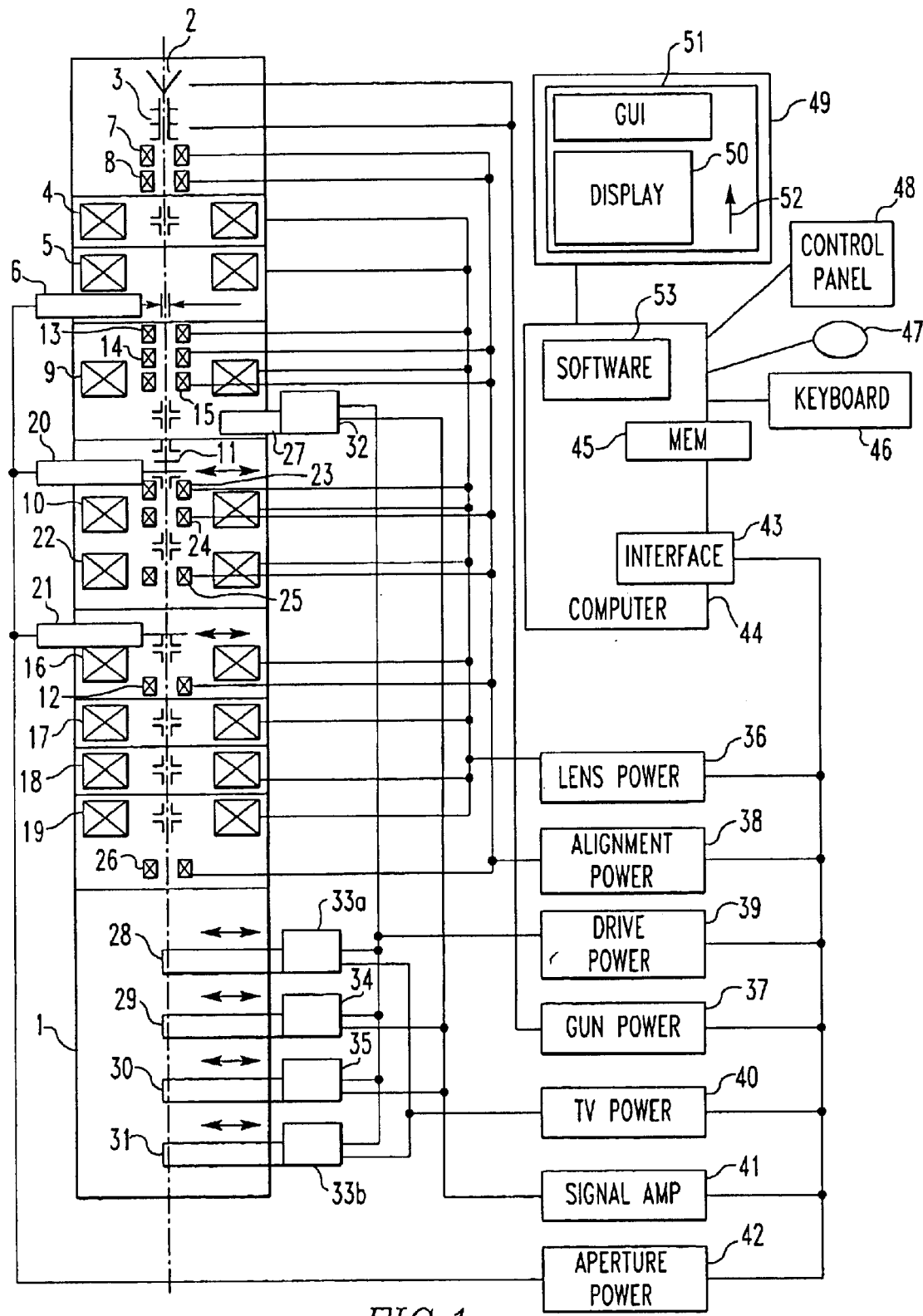
FIG. 1 is a diagram showing one example of electron microscope according to the present invention.

The preferred embodiment of the present invention is hereinafter described in detail by referring to the accompanying drawings. FIG. 1 shows an electron microscope according to the present invention. This microscope can operate in different imaging modes, i.e., (1) SEM imaging mode in which an electron beam is scanned across a specimen and a SEM image is created from secondary electrons emitted from the specimen surface, (2) STEM imaging mode in which the electron beam is similarly scanned across a specimen and a STEM image is created from electrons transmitted through the specimen, and (3) TEM imaging mode in which the electron beam is not scanned and a TEM image is created from electrons transmitted through a specimen.

In this figure, the microscope has an electron microscope column 1. An electron gun 2 mounted in an upper part of the microscope column 1 produces an electron beam. This beam is accelerated to 50 kV, for example, by an accelerator tube 3. The accelerated beam is focused by a first condenser lens 4 and a second condenser lens 5.

The central portion of the electron beam focused by the condenser lenses 4 and 5 passes through a hole in a condenser lens aperture 6. The outer portion of the beam that has larger aberration is blocked off by the aperture 6. This condenser lens aperture 6 has plural holes of different diameters. Depending on the operating mode of the microscope, a hole of an appropriate diameter is placed on the optical axis. A pair of alignment coils, 7 and 8, is mounted between the accelerator tube 3 and the condenser lens 4 to correct the misalignment of the electron beam with respect to the optical axis, the beam being produced by the electron gun 2 and accelerated by the accelerator tube 3.

The electron beam passed through the hole in the condenser lens aperture 6 is finely adjusted in focus by a condenser minilens 9. Then, the beam is directed at a specimen 11 placed within a magnetic field produced by an objective lens 10. An astigmatic correction lens 13 is positioned between the condenser lens aperture 6 and the specimen 11 to correct astigmatism in the condenser lens. Also, alignment and scanning coils 14 and 15 are mounted between the condenser lens aperture 6 and the specimen 11 to correct the misalignment of the beam with respect to the optical axis, the beam being focused by the condenser lenses 4 and 5. In the SEM imaging mode, the alignment coils 14 and 15 operate also as coils for two-dimensional scanning of the electron beam.

The magnetic field produced in front of the specimen 11 by the objective lens 10 contributes to focusing of the beam. The magnetic field set up behind the specimen 11 cooperates with rear-stage intermediate lenses 16, 17, 18 and a projector lens 19 to form an imaging lens system. An objective lens aperture 20 is positioned ahead of the objective lens 10. The outer portion of the beam having larger aberration is blocked off by the aperture 20. The objective lens aperture 20 has plural holes of different diameters. One of the holes of appropriate diameter is placed on the optical axis according to the operating mode of the microscope. An objective minilens 22 is positioned between the objective lens 10 and aperture 21 to finely adjust the magnetic field produced by the objective lens 10.

Mounted below the objective lens aperture 20 are an astigmatic correction lens 23 for correcting astigmatism in the objective lens 10 and image shift coils 24, 25 for electrically varying the observed range of the image. Beam alignment coils 12 and 26 are placed in a position close to the intermediate lens 16 and behind the projector lens 19, respectively.

A secondary electron detector 27 is mounted above the specimen 11. This detector 27 is operated during the SEM imaging mode. For example, a detector made of a scintillator and a photomultiplier is used as this electron detector 27. The secondary electrons from the specimen are accelerated onto the scintillator.

A first TV camera 28, such as a CCD camera, a detector 29 for dark field imaging, a detector 30 for bright field imaging, and a second TV camera 31, such as a CCD camera, are mounted behind the imaging lens system in this turn from above. The first TV camera 28 can be withdrawably moved to the optical axis by a drive mechanism 33*a*. The detector 29 for dark field imaging and the detector 30 for bright field imaging can be withdrawably moved to the optical axis by drive mechanisms 34 and 35, respectively. In addition, the second TV camera 31 can be withdrawably moved to the optical axis by a drive mechanism 33*b*.

The lenses within the column 1 (i.e., condenser lenses 4, 5, condenser minilens 9, objective lens 10, objective minilens 22, intermediate lenses 16–18, projector lens 19, and astigmatic correction lenses 13, 23) are supplied with exciting currents from a lens power supply 36. Desired high voltages are applied to the electron gun 2 and accelerator tube 3 from a high-voltage power supply 37.

Desired currents are supplied to electron gun alignment coils 7, 8, condenser lens alignment coils 14, 15, image shift coils 24, 25, and imaging lens alignment coils 12, 26 from an alignment power supply 38. As a result, these coils produce magnetic fields which appropriately correct misalignment of the electron beam and shift the position of the final image.

The drive mechanism 32 for the secondary electron detector 27, the drive mechanism 33*a* for the first TV camera 28, the drive mechanism 34 for the detector 29 for dark field imaging, the drive mechanism 35 for the detector 30 for bright field imaging, and the drive mechanism 33*b* for the second TV camera 31 are selectively driven by drive voltages from a detector drive power supply 39. Only one detector is placed onto or close to the optical axis.

Additionally, there is provided a TV power supply 40 to gain TEM image signals from the first TV camera 28 and second TV camera 31. Scanned image signals from the secondary electron detector 27, dark field imaging detector 29, and bright field imaging detector 30 are supplied to an image signal amplifier 41.

The apertures 6, 20, and 21 positioned along the optical axis within the column 1 are driven by an aperture drive power supply 42. The size of the hole in each aperture on the optical axis is selected optimally.

The lens power supply 36, high-voltage power supply 37, alignment power supply 38, detector drive power supply 39, power supply 40 for the TV cameras, detector signal amplifier 41, and aperture drive power supply 42 are connected with a computer 44 via an interface 43. As a result, the lens power supply 36, high-voltage power supply 37, alignment power supply 38, detector driver power supply 39, TV camera power supply 40, signal amplifier 41, and aperture drive power supply 42 are controlled by the computer 44.

A memory 45 is connected with the computer 44. Lens strengths and detectors which can be selected according to aperture holes are stored in the form of a table in the computer 44, together with the microscope imaging modes, electron gun accelerating voltages, and magnifications.

The lens strengths are previously stored such that, when the accelerating voltage of the electron gun is varied, for example, the electron beam is optimally focused onto the specimen 11 at the selected accelerating voltage and the electron image transmitted through the specimen is optimally projected onto the screen of the first TV camera 28 at the specified magnification, for example.

A keyboard 46, a mouse 47, a control panel 48, and a display device 49 are connected with the computer 44. Instruction commands can be given to the computer 44 and various settings can be made through the computer 44 by the keyboard 46 and mouse 47.

An image display region 50, a GUI (graphic user interface) 51 for control of the instrument, and a pointer 52 are displayed on the viewing screen of the display device 49. The pointer 52 can be moved across the viewing screen by the mouse 47 and keyboard 46. Of course, software 53 for controlling the various components of the electron microscope according to the specified mode or conditions is loaded in the computer 44. The operation of the microscope constructed in this way is next described.

The electron microscope shown in FIG. 1 is capable of TEM imaging, SEM imaging, and STEM imaging. Where a TEM (transmission electron microscope) image should be observed, the pointer 52 is moved into an area within the GUI 51 that indicates TEM, for example, using the keyboard 46 and mouse 47, the GUI being displayed on the display device 49. Then, the mouse 47 is clicked to select the TEM imaging mode.

When the TEM imaging mode is selected, the detector 29 for dark field imaging is moved off the optical axis by the drive mechanism 34. The detector 30 for bright field imaging is moved off the optical axis by the drive mechanism 35. Then, one of the first TV camera 28 and second TV camera 31 is moved onto the optical axis and the other is retracted from the optical axis by the drive mechanisms 33*a* and 33*b*.

This first TV camera 28 is used principally when an image is created at relatively low magnifications for wide-field imaging. This camera 28 is placed close to the projector lens 19. A high-resolution TV camera is used as the second TV camera 31 which is employed for imaging at relatively high magnifications. Which of the two TV cameras is used can be selected through the GUI 51 on the display device 49 of the computer 44.

For example, in the case of wide-field electron microscope imaging, the first TV camera 28 is placed on the optical axis. The second TV camera 31 is retracted from the optical axis. Under this condition, the computer 44 controls the exciting currents flowing through the condenser lenses 4, 5 and objective lens 10 such that a probe of a relatively large diameter of 1 nm is directed at the specimen 11. The computer also controls the exciting currents supplied to the intermediate lenses 16–18 and projector lens 19. An image created by electrons transmitted through the specimen 11 is focused onto the screen of the first TV camera 28.

The lenses are controlled in this way to shoot the electron beam from the electron gun 2 at the specimen 11. Consequently, a TEM image of a certain wide area on the specimen is projected onto the screen of the first TV camera 28. This image on the TV camera 28 is read out as a video signal and sent to the computer 44 via the TV camera power supply 40 used to gain a TEM image. The video signal supplied to the computer 44 is fed to the display device 49. As a result, a TEM image of a wide area is displayed on the image display region 50 of the viewing screen of the display device 49 at a relatively low magnification.

Where a high-resolution electron microscope should be observed at a relatively high magnification, the first TV camera 28 is retracted from the optical axis by the drive mechanism 33a. The second TV camera 31 is placed onto the optical axis by the drive mechanism 33b. At this time, the strengths of the intermediate lenses 16–18 and projector lens 19 are adjusted such that an electron image is focused onto the screen of the second TV camera 31 placed on the bottom of the column 1.

The image projected on the screen of the TV camera 31 is read out as a video signal and sent to the computer 44 via the TV camera power supply 40 used to gain a TEM image. The video signal supplied to the computer 44 is furnished to the display device 49. A high-resolution TEM image is displayed on the image display region 50 of the viewing screen of the display device 49 at a high magnification. The image obtained using the first TV camera 28 is used to search for a field of view of interest. The image obtained using the second TV camera 31 is a high-resolution image of the desired area on the specimen. This high-resolution image has been derived as a result of the search for the field of view of interest.

The operation in the SEM imaging mode and in the STEM imaging mode is next described. Where SEM imaging mode or STEM imaging mode is performed, the pointer 52 is placed in an area of the GUI 51 where term "SEM" or "STEM" is displayed, using the keyboard 46 and mouse 47. Then, the mouse 47 is clicked to select the SEM or STEM mode.

When this SEM mode is selected, the computer 44 controls the detector drive power supply 39. The detector 29 for dark field imaging and the detector 30 for bright field imaging are retracted from the optical axis. The first TV camera 28 and the second TV camera 31 are also moved away from the optical axis.

Under this condition, the computer 44 controls the excitation currents through the condenser lenses 4, 5 and objective lens 10 such that a probe of a relatively small diameter of about 0.2 nm is directed at the specimen 11. The lenses are controlled in this manner. The electron beam from the electron gun 2 is shot at the specimen 11. A two-dimensional scanning signal for the beam is supplied to the condenser lens alignment coils 14 and 15. In consequence, the beam is scanned in two dimensions over a desired region on the specimen 11.

Secondary electrons emitted from the surface of the specimen 11 in response to the two-dimensional scanning of the electron beam across the surface are guided to the secondary electron detector 27, where the electrons are detected. The resulting signal is supplied as a video signal to the computer 44 via the amplifier 41. The video signal fed to the computer 44 is supplied to the display device 49. As a result, a SEM image is displayed on the image display region 50.

If the STEM mode is then selected, the computer 44 controls the detector drive power supply 39. The drive mechanisms 33a and 33b are driven to move one of the dark field imaging detector 29 and bright field imaging detector 30 into the optical axis and to retract the other from the optical axis. The first TV camera 28 and second TV camera 31 are also retracted from the optical axis.

Under this condition, the computer 44 controls the excitation currents supplied to the condenser lenses 4, 5 and objective lens 10 so that a probe of a relatively small diameter of about 0.2 nm is directed at the specimen 11. The lenses are controlled in this way to direct the electron beam from the electron gun 2 at the specimen 11. A signal for scanning the electron beam in two dimensions is supplied to the condenser lens alignment coils 14 and 15. Consequently, a desired region on the specimen 11 is scanned in two dimensions by the beam.

Electrons transmitted through the specimen 11 in response to the two-dimensional scanning of the beam across the specimen surface are detected by either the dark field imaging detector 29 or bright field imaging detector 30. The resulting signal is supplied as a video signal to the computer 44 via the amplifier 41. The video signal fed to the computer 44 is supplied to the display device 49. As a result, a STEM image of bright or dark field is displayed on the image display region 50.

Figure 2:
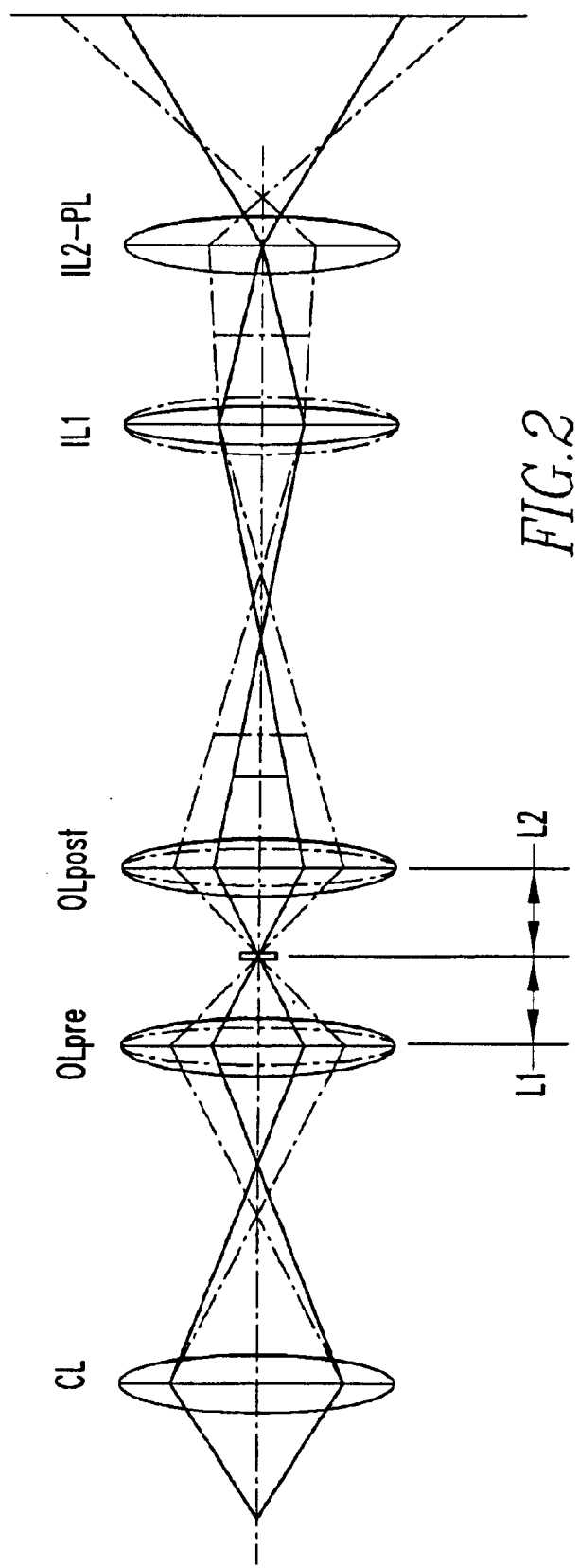
FIG. 2 is a ray diagram showing lens strengths and optical paths in SEM imaging mode and TEM imaging mode.

The lens strengths and optical paths used in the TEM imaging mode and SEM/STEM imaging mode are shown in FIG. 2 as a reference. In FIG. 2, the solid lines indicate the lens strengths and optical path in the TEM imaging mode. The broken lines indicate the lens strengths and optical paths in the SEM/STEM mode. In this figure, indicated by CL is a condenser lens that is shown to consist of one stage, although in the instrument of FIG. 1, the condenser lens system is made up of two stages of condenser lenses. The objective lens 10 produces a magnetic field OLpre ahead of the specimen and a magnetic field OLpost behind it.

The two-stage intermediate lenses of the instrument of FIG. 1 are shown to be made of a single stage of first intermediate lens IL1. IL2+PL indicates the resultant lens of the third stage of intermediate lens and the projector lens shown in FIG. 1. As can be seen from this diagram, in the SEM/STEM imaging mode, the objective lens 10 is more strongly excited and the intermediate lenses are less excited than in the TEM imaging mode.

As described thus far, the instrument shown in FIG. 1 can perform TEM imaging, SEM imaging, and STEM imaging. What is important in the SEM and STEM imaging modes is that astigmatism in the probe shot at the specimen is zero or infinitesimal. It is also important that the electron beam be aligned such that the beam is shot at the specimen along the optical axis.

In the past, this correction of astigmatism and beam alignment have been performed in a trial-and-error manner by adjusting the knobs on the various stigmators or adjusting the currents supplied to the alignment coils while watching the TEM, SEM, or STEM image displayed on the display device 49. Therefore, it has been difficult even for a skilled operator to correct astigmatism properly or to align the electron beam precisely in a short time.

Figure 3:
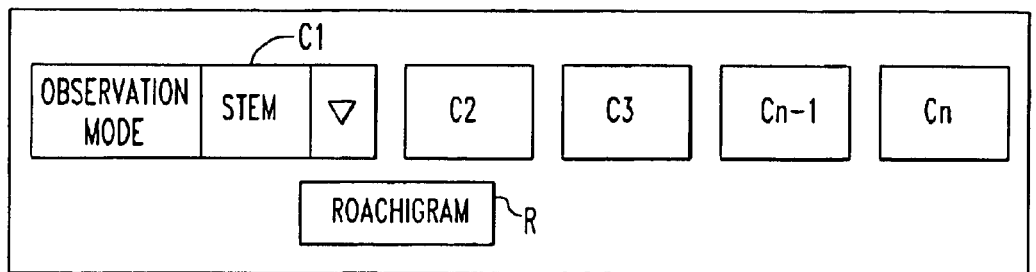
FIG. 3 is a diagram showing one example of graphic user interface (GUI) on a display device.

In the present invention, a display region for displaying Ronchigram operations is set on the display device 49. When the pointer 52 is placed in this display region and the mouse 47 is clicked, either the first TV camera 28 or second TV camera 31 is selected as a detector. The conditions of the various lenses are set to values adapted for display of a Ronchigram. FIG. 3 shows one example of the Ronchigram display region R on the display device 49. This Ronchigram display region R is established together with display regions C1, C2, . . . , Cn for setting of various conditions. C1 is a condition-setting region for selecting SEM, STEM, or TEM imaging mode.

The Ronchigram is a diffraction pattern image of the electron beam created along the optical axis out of an electron diffraction pattern transmitted through the specimen 11 in the STEM imaging mode. FIG. 4 shows examples of Ronchigram, and in which (a) shows a Ronchigram observed when the electron beam shot at the specimen 11 has no astigmatism, (b) shows a Ronchigram observed when there is astigmatism, and (c) shows a Ronchigram observed when the electron beam is misaligned with respect to the optical axis.

Figure 4A:
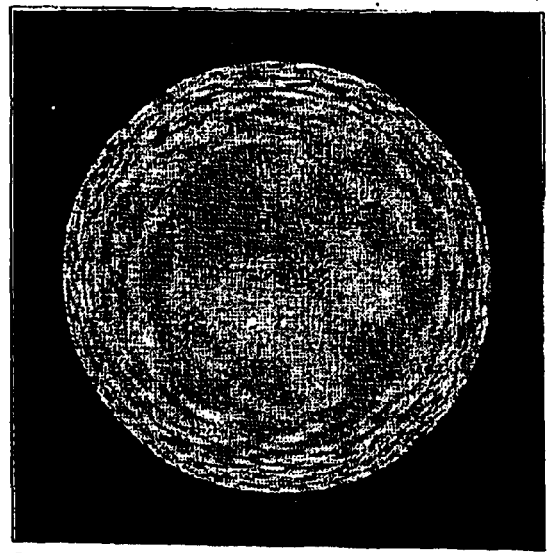
FIGS. 4(a), 4(b), and 4(c) show Ronchigrams.

The Ronchigram of FIG. 4(a) shows a circular diffraction pattern in which a major image portion occupies a relatively large area in the center. Relatively thin disturbed image portions in peripheral portions that are shadow portions of the condenser lens apertures are also seen. These disturbed portions are generally narrow and relatively uniform in width over the whole periphery. Where such a Ronchigram is obtained, it can be judged that the electron beam shot at the specimen 11 has almost no astigmatism and that the beam is accurately aligned.

Figure 4B:
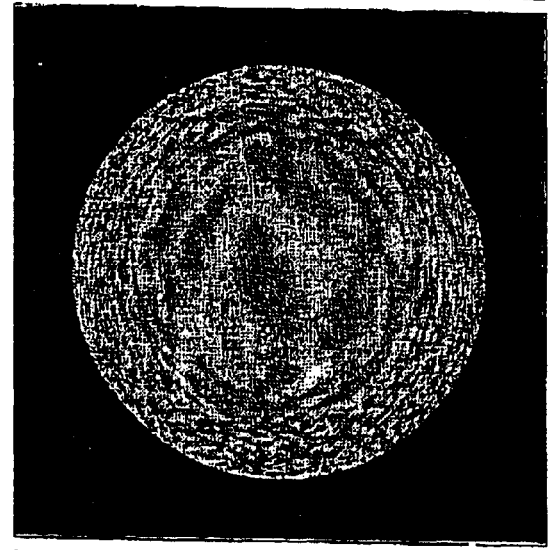

The Ronchigram of FIG. 4(b) shows a circular diffraction pattern in which a major image portion occupies a relatively small area in the center. Relatively thin disturbed image portions in peripheral portions that are shadow portions of the condenser lens apertures are relatively wide as a whole and not uniform over the whole periphery. Where such a Ronchigram is obtained, it can be judged that the electron beam hitting the specimen 11 has astigmatism.

Figure 4C:
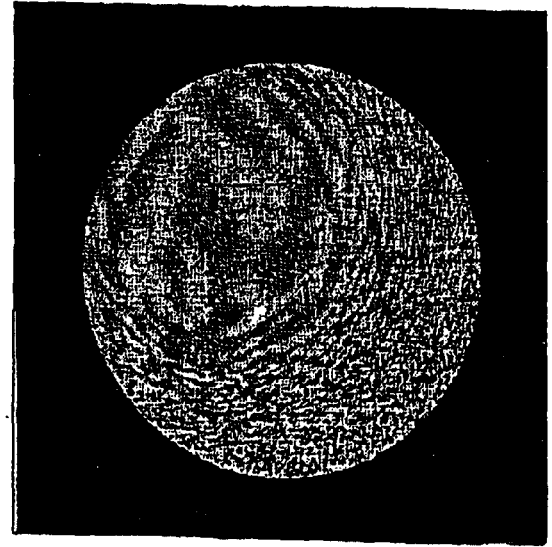

The Ronchigram of FIG. 4(c) shows a circular diffraction pattern in which a major image portion occupies a relatively small area and is off the center. Relatively thin disturbed image portions in peripheral portions that are shadow portions of the condenser lens apertures occupy a considerable portion of the whole area of the Ronchigram. Where such a Ronchigram is obtained, it can be judged that the electron beam hitting the specimen 11 is not accurately aligned.

When a Ronchigram shown in FIG. 4(b) or (c) is obtained, the astigmatic correction lens 13 and astigmatic correction lens 23 are adjusted. Also, the electron gun alignment coils 7, 8 and condenser lens alignment coils 14, 15 are adjusted. If a Ronchigram as shown in FIG. 4(a) is displayed, astigmatism in the beam shot at the specimen 11 can be almost completely removed. In addition, the alignment of the beam can be adjusted precisely.

Astigmatic correction and beam alignment can be easily performed even by an unskilled operator by displaying a Ronchigram and adjusting the astigmatic correction lenses and alignment coils while watching the Ronchigram until the state shown in FIG. 4(a) is reached. The electron beam which has almost no astigmatism as shown in FIG. 4(a) and is free of misalignment can be shot at the specimen 11.

The present invention permits even an unskilled operator operating the electron microscope to display this Ronchigram with ease. The operation performed to display a Ronchigram with the instrument shown in FIG. 1 is next described by referring to the flowchart of FIG. 5.

Lens strengths of various lenses under various conditions including accelerating voltages in the Ronchigram display mode have been previously stored in the form of a table in the memory 45 connected with the computer 44. In the Ronchigram display mode, the electron microscope of FIG. 1 is operated in the STEM imaging mode. That is, in FIG. 2, the strengths of the various lenses and the optical path of the electron beam are as indicated by the broken lines.

It can be seen from FIG. 2 that the spot diameter on the specimen surface can be varied without moving the position of the specimen 11, i.e., while maintaining constant the distance L1 to the front magnetic field produced by the objective lens and the distance L2 to the rear magnetic field set up by the objective lens, by varying the excitations of the condenser lens system CL and objective lens OL.

At this time, in order to image a diffraction pattern on the screen S of a TV camera, it is necessary to vary the excitations of the intermediate lenses IL. Furthermore, in order to display a pattern of appropriate size on the screen S and to suppress the brightness within the tolerable range of the TV camera, it is necessary to magnify or demagnify the diffraction pattern imaged by the first intermediate lens IL1 to an appropriate size by means of the imaging lens system made up of IL2 and PL located downstream of the first intermediate lens IL1.

Current values through the imaging lenses IL1 to PL which are best adapted for Ronchigram display are stored as a table in the memory 45 of the computer 44 as mentioned previously. Therefore, when the mode is varied from the TEM imaging mode to the STEM imaging mode during the Ronchigram display mode, for example, data about Ronchigram display is read from the memory 45 of the computer 44. The lenses are set to these stored current values. In this way, a diffraction pattern of appropriate size and brightness can be displayed on the screen S of the TV camera.

Figure 5:
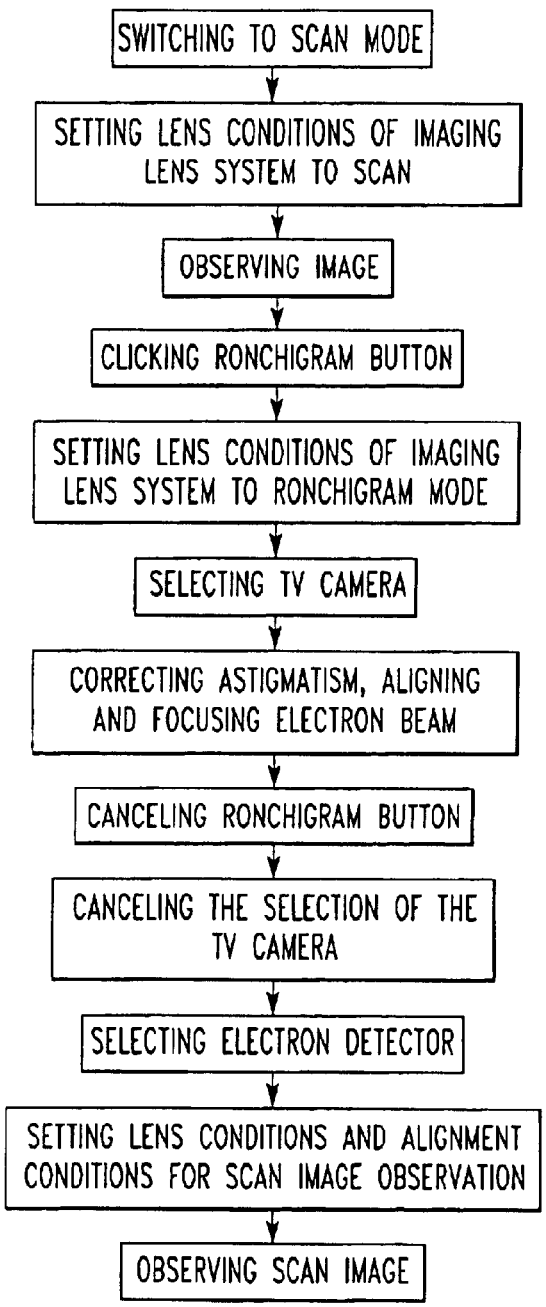
FIG. 5 is a flowchart illustrating the operation of the electron microscope shown in FIG. 1.

The operation is now described by referring to the flowchart of FIG. 5. First, the microscope operator issues an instruction for setting the illumination electron optics to the SEM imaging mode, using the GUI 51 and pointer 52 on the display device 49. According to this instruction, the computer 44 sets the illumination system of the electron optics, which shoots the electron beam at the specimen, to the state indicated by the broken lines in FIG. 2. A SEM image is displayed on the display region 50 on the display device 49 according to the output signal from the secondary electron detector 27. The operator observes this SEM image and searches for a field of view adapted for Ronchigram display.

This search can also be performed by setting the conditions of the imaging lens system to the STEM imaging mode, displaying a STEM image using either the dark field imaging detector 29 or bright field imaging detector 30, and observing the image. The search for a desired field of view is an operation consisting of moving the specimen 11 while observing the image and bringing a field of view capable of clearly displaying astigmatism or misalignment by means of a Ronchigram onto the optical axis (i.e., the center of the image). At this time, the used specimen is preferably made of an amorphous specimen of carbon or the like.

After bringing the field of view capable of clearly displaying astigmatism or misalignment by means of a Ronchigram onto the optical axis, the operator clicks the mouse on the Ronchigram Button of the GUI 51. If this Ronchigram display mode is selected, the lenses and alignment coils are controlled such that focusing conditions adapted for a Ronchigram are set. The detector 29 or 30 is retracted from the optical axis while maintaining the electron optics in the STEM imaging mode. Either the TV camera 28 or 31 is selected and placed onto the optical axis. These operations are automatically done by the computer 44 once the Ronchigram display mode is selected. During the Ronchigram display mode, an electron probe having a relatively small diameter of about 0.2 nm is stationarily shot at the specimen 11. The beam is not scanned across the specimen.

Under this condition, a Ronchigram signal is obtained from the TV camera and supplied to the computer 44 via the TV camera power supply 40 and interface 43. Advantageously, data about lens strengths and current values supplied to the alignment coils is previously stored in the memory 45. When the Ronchigram display mode is selected, data stored in the memory 45 is read out, and appropriate currents are supplied to the lenses and coils according to the data. In this way, a Ronchigram of appropriate size and brightness is displayed in the image display region 50 on the display device 49.

The operator adjusts the current values supplied to the astigmatic correction lens 13 for the condenser lens and astigmatic correction lens 23 for the objective lens while observing the Ronchigram displayed in the display region 50. The operator operates the control panel 48 to set the computer 44 at astigmatic correction power-supply values which bring the displayed Ronchigram into an astigmatism-free state as shown in FIG. 4(a).

The operator also adjusts the current values supplied into the alignment coils 7, 8 of the electron gun 2, alignment coils 14, 15 of the condenser lenses, and alignment coil 26 of the projector lens while watching the Ronchigram displayed in the display region 50, and operates the control panel 48 such that the displayed Ronchigram assumes the state shown in FIG. 4(a). An octopole coil is used as each alignment coil. This is not limited to an electromagnetic correction device. An electrostatic octopole lens may also be used.

After astigmatism in the Ronchigram shown in the display region 50 is corrected as shown in FIG. 4(a) and an appropriate alignment is made, the Ronchigram Button is activated by the pointer 52 to cancel the Ronchigram imaging mode. As a result, the TV cameras 28 and 31 are retracted from the optical axis. A selection is made from the detector 27 for secondary electron imaging, the detector 30 for bright field imaging, and the detector 29 for dark field imaging. Consequently, the selected one of the detectors 30 and 29 is placed onto the optical axis.

Lens conditions and alignment conditions for scanned image observation are read from the memory 45 under control of the computer 44. The lenses and alignment coils are automatically set at the conditions read out. Under this condition, the beam is started to be scanned. A scanned image (SEM image or STEM image in dark or bright field) is created and observed. Since astigmatism in the electron beam hitting the specimen and beam misalignment have been corrected, a high-resolution image can be obtained.

While an embodiment of the present invention has been described thus far, the invention is not limited thereto but rather can be modified variously. In the above embodiment, three kinds of images can be observed as scanned images. The invention can also be applied to an instrument capable of producing one or two kinds of scanned images. In addition, in the above embodiment, secondary electrons are detected. Instead, backscattered electrons may be detected.

Furthermore, in the above embodiment, a scanned image is used to search a specimen for a desired field of view from which a Ronchigram will be gained. To select an appropriate specimen position, TEM imaging mode may also be used. In this case, the lens strengths may be first set at the conditions indicated by the solid lines in the electron optics shown in FIG. 2. The optical path may also be set to the state indicated by the solid lines. Electrons transmitted through the specimen may be detected by a TV camera, and a TEM image may be displayed. The specimen may be moved. In this way, a field of view capable of clearly displaying astigmatism or beam misalignment in terms of a Ronchigram may be placed onto the optical axis. Then, the Ronchigram Button is activated to set the conditions of the electron optics to the STEM imaging mode. The portion hit by the beam may be fixed on a specimen portion lying on the optical axis, and a Ronchigram may be displayed.

As described thus far, the present invention facilitates displaying a Ronchigram. The operator can correct astigmatism in the electron beam or misalignment of the beam with respect to the optical axis while observing the Ronchigram. Consequently, the correction can be made with greater ease and higher accuracy than where astigmatism or misalignment is corrected while observing a TEM or SEM image in a conventional manner. Hence, the resolution of an image of the specimen such as STEM or SEM image obtained by scanning an electron beam probe can be enhanced.

Having thus described our invention with the detail and particularity required by the Patent Laws, what is desired protected by Letters Patent is set forth in the following claims.

The invention claimed is:

1. An electron microscope having an electron gun for producing an electron beam, the microscope being capable of being switched between (a) TEM imaging mode in which the electron beam is shot at a specimen by an illumination lens system, a TEM image of the specimen is formed out of electrons transmitted through the specimen by an imaging lens system, and the TEM image is made visible by observational means, and (b) scanning imaging mode in which the electron beam is focused onto the specimen by the illumination lens system, the beam is scanned across the specimen in two dimensions by deflection means mounted on a side of the specimen that faces the electron gun, resulting electrons from the specimen detected by at least one electron detector, and a scanned image of the specimen is displayed on a viewing screen of display means according to an output signal from the electron detector, said electron microscope comprising:

astigmatic correction means for correcting astigmatism in the electron beam shot at the specimen;

beam alignment means for aligning the electron beam shot at the specimen with respect to an optical axis;

instruction means for commanding a Ronchigram display mode; and a control system which, when the Ronchigram display mode is commanded by the instruction means, controls the illumination lens system in such a way that the electron beam from the electron gun is focused onto the specimen, controls the deflection means such that the electron beam is stationarily directed at the specimen, and controls the imaging lens system such that a diffraction image on the optical axis which is created by electrons transmitted through the specimen creates a visible image on the observational means, wherein when commanding of the Ronchigram display mode is canceled, said control system maintains said lens conditions of said illumination lens system, controls said deflection means in such a way that the electron beam focused by said illumination lens system is scanned in two dimensions across the specimen, and switches the imaging mode to said scanning imaging mode.

2. The electron microscope of claim 1, wherein lens strength values of various lenses and corresponding accelerating voltage values which can be used in the Ronchigram display mode are stored in the form of a table in a memory, and wherein said control system controls display of a Ronchigram according to information stored in the memory.

3. An electron microscope having an electron gun for producing an electron beam, the microscope being capable of being switched between (a) TEM imaging mode in which the electron beam is shot at a specimen by an illumination lens system, a TEM image of the specimen is formed out of electrons transmitted through the specimen by an imaging lens system, and the TEM image is made visible by observational means, and (b) scanning imaging mode in which the electron beam is focused onto the specimen by the illumination lens system, the beam is scanned across the specimen in two dimensions by deflection means mounted on a side of the specimen that faces the electron gun, resulting electrons from the specimen detected by at least one electron detector, and a scanned image of the specimen is displayed on a viewing screen of display means according to an output signal from the electro detector, said electron microscope comprising;

astigmatic correction means for correcting astigmatism in the electron beam shot at the specimen;

beam alignment means for aligning the electron beam shot at the specimen with respect to an optical axis;

instruction means for commanding a Ronchigram display mode; and a control system which, when the Ronchigram display mode is commanded by the instruction means, controls the illumination lens system in such a way at the electron beam from the electron gun is focused onto the specimen, controls the deflection means such that the electron beam is stationarily directed at the specimen, and controls the imaging lens system such that a diffraction image on the optical axis which is created by electrons transmitted through the specimen creates a visible image on the observational means, wherein said observational means is fitted with a camera that is withdrawably placed on the optical axis and behind said imaging lens system, wherein said electron detector is placed behind said imaging lens system so as to be capable of being inserted to and withdrawn from the optical axis, and wherein said control system controls drive mechanisms for said camera and said electron detector in the TEM imaging mode and in the Ronchigram display mode in such a way that the camera is placed on the optical axis and the electron detector is retracted from the optical axis and controls said drive mechanisms in said scanning imaging mode for obtaining a STEM image in such a way that the electron detector is placed on the optical axis and the camera is retracted from the optical axis.

4. The electron microscope of claim 3, wherein there are further provided a first camera capable of gaining a signal indicative of a wide-field image and a second camera capable of gaining a signal indicative of a high-resolution image, the first and second cameras being spaced a given distance along the optical axis, and wherein any one of the first and second cameras is placed on the optical axis in the TEM imaging mode and in the Ronchigram display mode.

5. The electron microscope of claim 3, wherein said at least one electron detector consists of a detector for dark field imaging and a detector for bright field imaging, and wherein any one of these detectors is placed on the optical axis instead of the camera when the STEM image is observed.

6. The electron microscope of any one of claims 2–5, wherein a secondary electron detector is positioned above the specimen.

* * * * *

UNITED STATES PATENT AND TRADEMARK OFFICE
CERTIFICATE OF CORRECTION

PATENT NO. : 6,841,775 B2
DATED : January 11, 2005
INVENTOR(S) : Kondo et al.

It is certified that error appears in the above-identified patent and that said Letters Patent is hereby corrected as shown below:

Column 10,
Line 45, "from the specimen detected" should read -- from the specimen are detected --

Column 11,
Line 25, "from the specimen detected" should read -- from the specimen are detected --
Line 25, "electro detector" should read -- electron detector --
Line 38, "a way at the" should read -- a way that the --

Signed and Sealed this

Twelfth Day of July, 2005

JON W. DUDAS
*Director of the United States Patent and Trademark Office*